(12) United States Patent
Lin

(10) Patent No.: US 6,842,342 B1
(45) Date of Patent: Jan. 11, 2005

(54) HEAT SINK

(75) Inventor: Chao-Chi Lin, Taichung (TW)

(73) Assignee: Leohab Enterprise Co., Ltd., Taichung (TW)

( * ) Notice: Subject to any disclaimer, the term of this patent is extended or adjusted under 35 U.S.C. 154(b) by 0 days.

(21) Appl. No.: 10/662,186

(22) Filed: Sep. 12, 2003

(51) Int. Cl.[7] .......................... H05K 7/20; H01L 23/26; H01L 23/367

(52) U.S. Cl. ...................... 361/710; 361/702; 361/696; 361/697; 257/706; 165/80.3

(58) Field of Search ................. 361/695–697, 361/701–704, 709, 710; 257/705–707, 713, 717–719; 165/80.3, 185; 174/16.3; 248/510

(56) References Cited

U.S. PATENT DOCUMENTS

| | | | | |
|---|---|---|---|---|
| 3,205,936 A | * | 9/1965 | Katz .......................... 165/80.3 |
| 3,864,607 A | * | 2/1975 | Phillips ....................... 361/692 |
| 4,669,535 A | * | 6/1987 | Seidler ......................... 165/78 |
| 4,777,560 A | * | 10/1988 | Herrell et al. ............... 361/694 |
| 4,897,712 A | * | 1/1990 | Prokopp .................... 165/80.2 |
| 5,125,451 A | * | 6/1992 | Matthews ................... 165/80.4 |
| 5,370,178 A | * | 12/1994 | Agonafer et al. ........... 165/137 |
| 5,437,328 A | * | 8/1995 | Simons ....................... 165/146 |
| 5,509,465 A | * | 4/1996 | Lai ............................. 165/80.3 |
| 5,514,327 A | * | 5/1996 | Schneider ..................... 419/36 |
| 5,525,753 A | * | 6/1996 | Mennucci et al. .......... 174/16.3 |
| 5,583,317 A | * | 12/1996 | Mennucci et al. .......... 174/16.3 |
| 5,654,587 A | * | 8/1997 | Schneider et al. ........... 257/718 |
| 5,686,190 A | * | 11/1997 | Mennucci et al. .......... 428/472 |
| 5,777,259 A | * | 7/1998 | Mennucci et al. .......... 174/16.3 |
| 5,900,670 A | * | 5/1999 | Schneider et al. ........... 257/718 |
| 5,947,192 A | * | 9/1999 | Kuo ........................... 165/80.3 |
| 6,076,594 A | * | 6/2000 | Kuo ........................... 165/80.3 |
| 6,199,627 B1 | * | 3/2001 | Wang .......................... 165/185 |
| 6,450,250 B2 | * | 9/2002 | Guerrero ............... 165/104.33 |
| 6,684,501 B2 | * | 2/2004 | Ellsworth et al. ......... 29/890.03 |
| 2002/0195231 A1 | * | 12/2002 | Siu ........................ 165/104.33 |
| 2003/0209342 A1 | * | 11/2003 | Hsin et al. .................. 165/80.3 |

FOREIGN PATENT DOCUMENTS

| | | | | |
|---|---|---|---|---|
| JP | 03270058 A | * | 12/1991 | ............ H01L/23/36 |
| JP | 2002237557 A | * | 8/2002 | ......... H01L/23/373 |

* cited by examiner

Primary Examiner—Anatoly Vortman
(74) Attorney, Agent, or Firm—Alan D. Kamrath; Nikolai & Mersereau, P.A.

(57) ABSTRACT

A heat sink includes a strip, two flanges extending from a side of the strip, at least one slot defined in the strip near each of the flanges, at least one tongue projecting from an internal side of each of the flanges and at least one lug projecting an edge of each of the flanges and defining an aperture. The lugs can be inserted through the slots of another heat sink so that the apertures thereof can receive the tongues of the other heat sink.

6 Claims, 9 Drawing Sheets

HEAT SINK

FIELD OF INVENTION

The present invention relates to a heat sink.

BACKGROUND OF INVENTION

Referring to FIGS. 7 and 8, a conventional heat sink system 80 includes a plurality of heat sinks 81. Each heat sink 81 includes a strip 84 and two flanges 85 extending from a side of the strip 84. A recess 82 is cut into the strip 84 in order to receive copper bars 83. The heat sinks 81 are attached to the copper bars 83 via soldering. However, it is difficult to align the heat sinks 81 with one another. Moreover, the heat sinks 81 are not connected with one another but, instead, individually attached to the copper bars 83.

Referring to FIG. 9, another conventional heat sink system 90 includes a plurality of heat sinks 91. Each heat sink 91 includes a strip 94 and two flanges 95 extending from a side of the strip 94. A recess (not shown) is cut into the strip 94 in order to receive copper bars. The heat sinks 91 are attached to the copper bars via soldering. Each flange 95 defines a recess 96 and includes an edge 97 that can be put in a recess 96 of another heat sink 91. However, the heat sinks 91 would be connected with one another inadequately but for the copper bars.

The present invention is hence intended to obviate or at least alleviate the problems encountered in prior art.

SUMMARY OF INVENTION

It is the primary objective of the present invention to provide a heat sink that can be firmly connected with another heat sink without using any external fastener.

According to the present invention, a heat sink includes a strip, two flanges extending from a side of the strip, at least one slot defined in the strip near each of the flanges, at least one tongue projecting from an internal side of each of the flanges and at least one lug projecting an edge of each of the flanges and defining an aperture. The lugs can be inserted through the slots of another heat sink so that the apertures thereof can receive the tongues of the other heat sink.

Other objects, advantages and novel features of the invention will become more apparent from the following detailed description in conjunction with the attached drawings.

BRIEF DESCRIPTION OF DRAWINGS

The present invention will be described via detailed illustration of embodiments referring to the drawings.

DETAILED DESCRIPTION OF EMBODIMENTS

Figure 1:
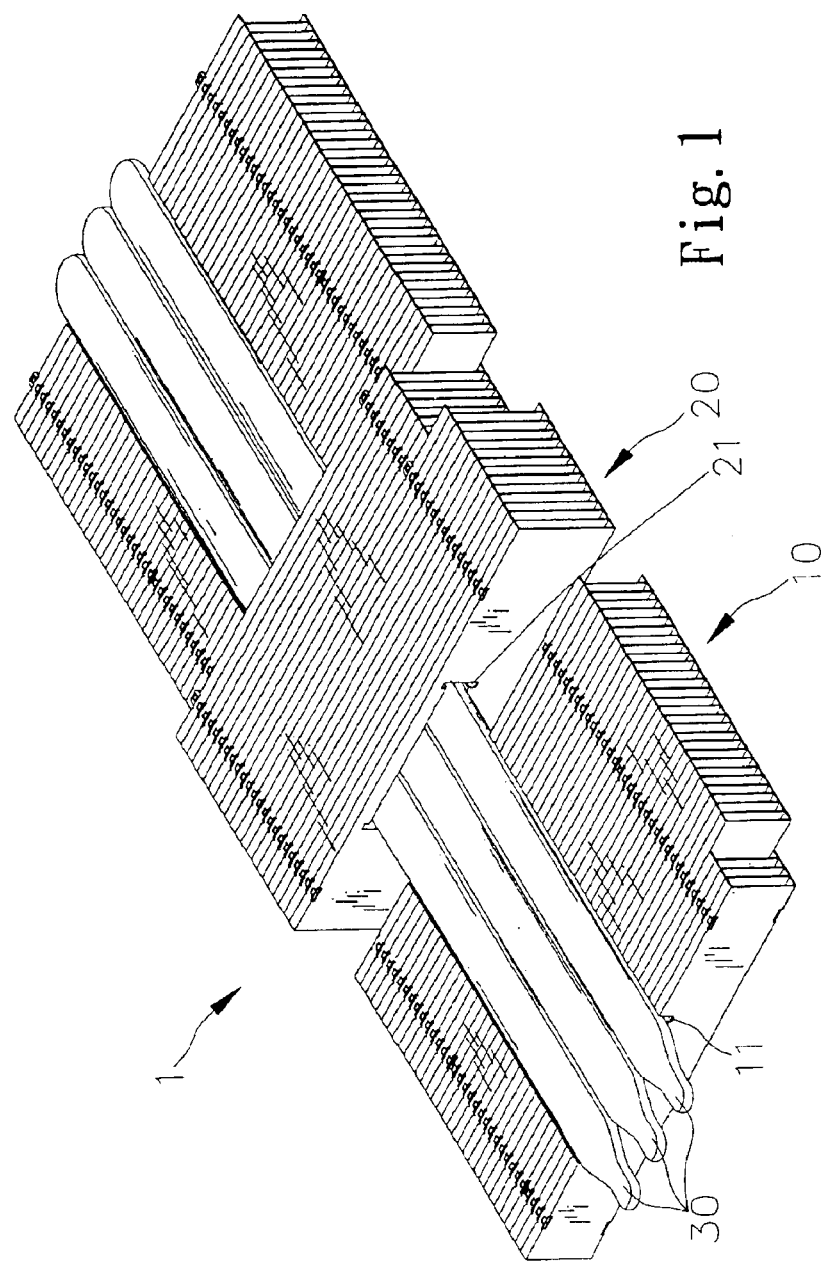
FIG. 1 is a perspective view of a heat sink system according to a first embodiment of the present invention.

Referring to FIG. 1, a heat sink system 1 includes a plurality of heat sinks 10 according to a first embodiment of the present invention, a plurality of heat sinks 20 according to a second embodiment of the present invention and a plurality of copper bars 30. The heat sinks 10 and 20 may be secured to the copper bars 30 via soldering.

Figure 2:
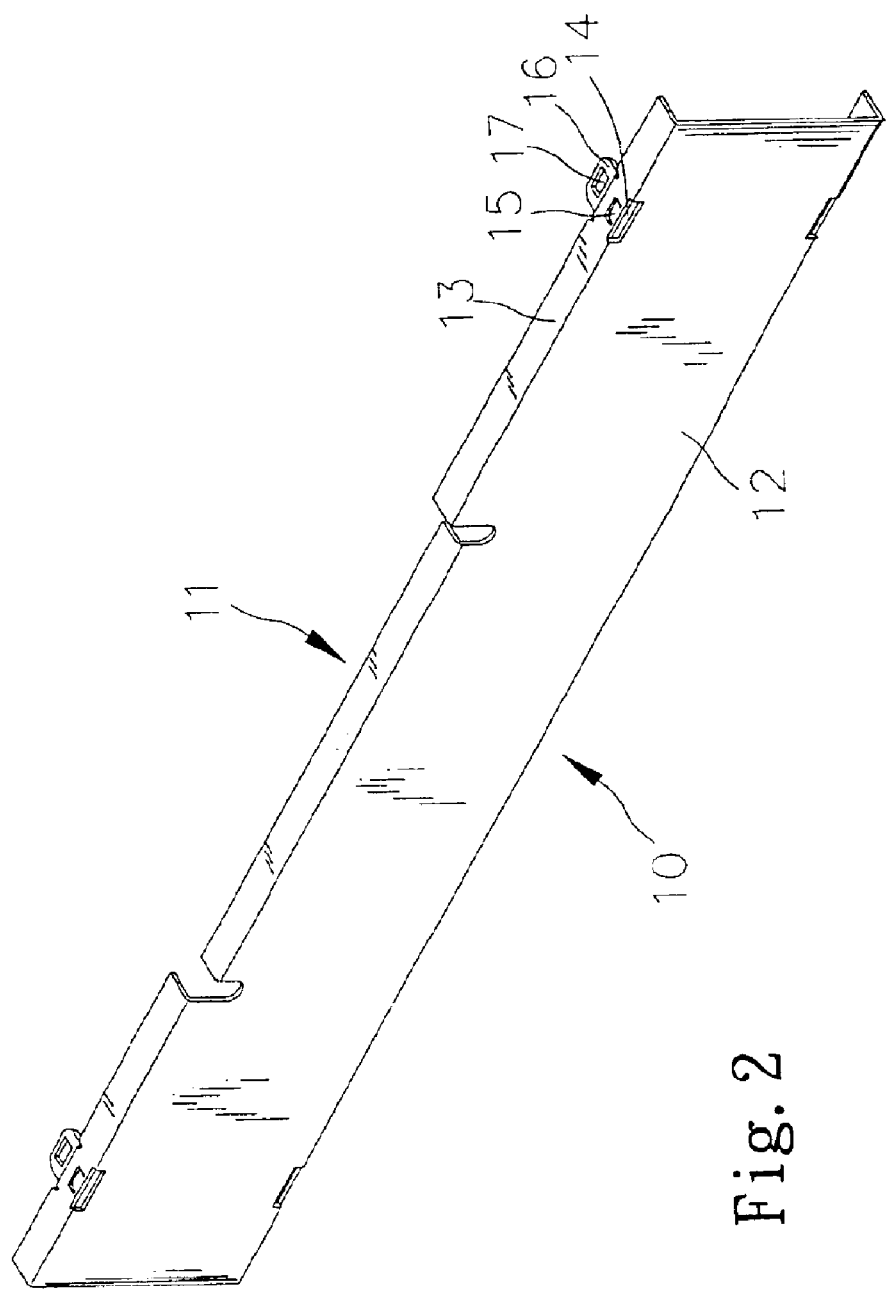
FIG. 2 is a perspective view of a heat sink of a first type used in the heat sink system of FIG. 1.

FIG. 2 shows a heat sink 10 according to a first embodiment of the present invention. The heat sink 10 includes a strip 12 and two flanges 13 extending from a side of the strip 12. A recess 11 is cut into the strip 12 in order to receive the copper bars 30.

Two slots 14 are defined in the strip 12 near each flange 13. Two tongues 15 extend from an internal side of each flange 13. Each tongue 15 is formed via cutting a U-shaped slit into each flange 13 and bending a portion of the flange 13 confined in the U-shaped slit. Such cutting and bending can be completed in a punching process using a proper die.

Figure 3:
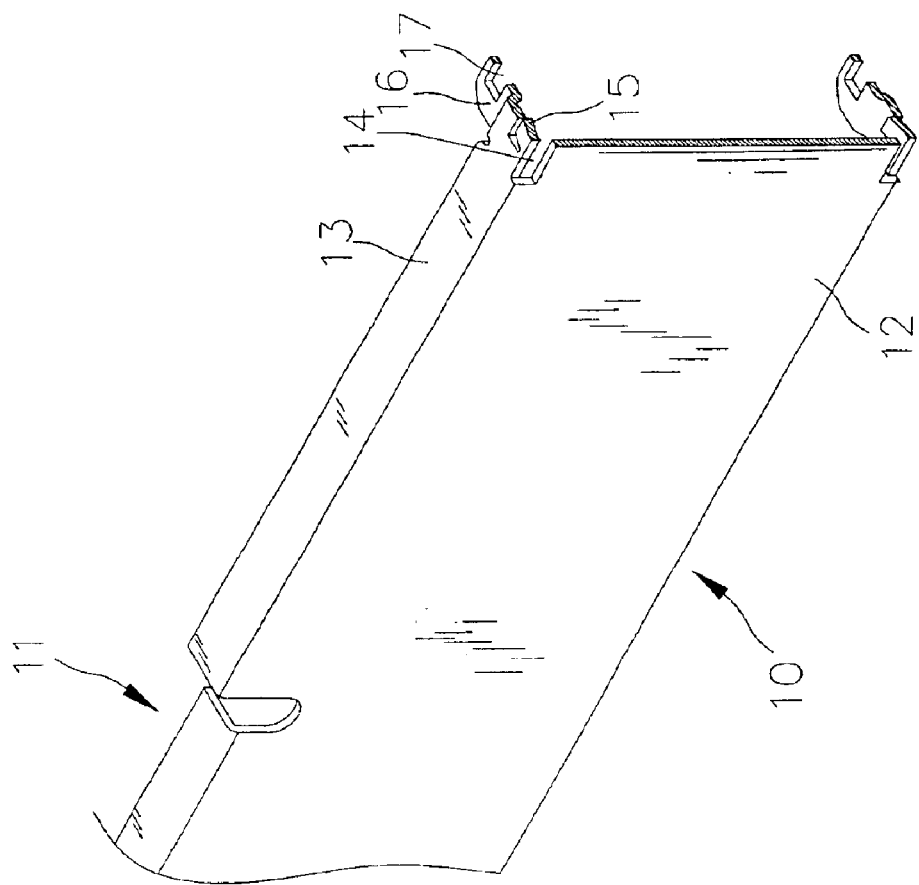
FIG. 3 is a cut-away view of the heat sink of FIG. 2.

Referring to FIG. 3, two lugs 16 extend from each flange 13 in a Z-figured path so that the lugs 16 extend between the flanges 13. Each lug 16 defines an aperture 17.

Figure 4:
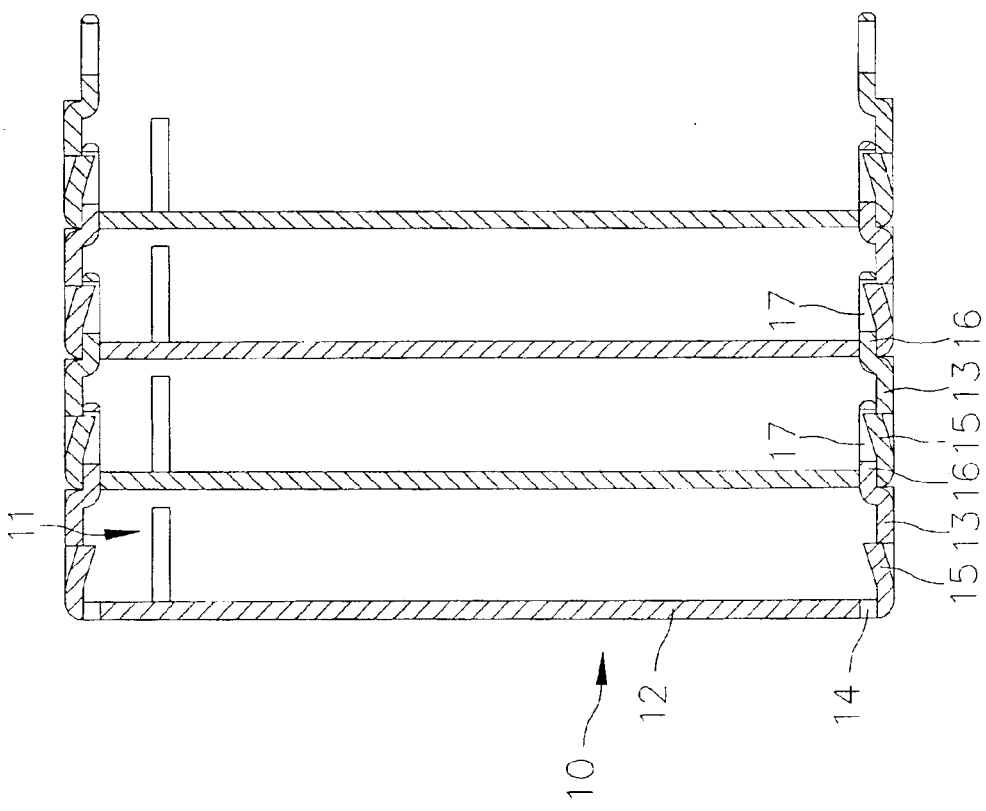
FIG. 4 is a cross-sectional view of several heat sinks of FIG. 2 connected with one another.

Referring to FIG. 4, several heat sinks 10 are assembled. For the convenience of description, they are referred to as first, second, third and fourth heat sinks 10 from the left to the right. The lugs 16 of the first heat sink 10 are inserted through the slots 14 defined in the second heat sink 10. Thus, the first heat sink 10 is aligned with the second heat sink 10. The tongues 15 of second heat sink 10 are inserted in the apertures 17 defined in the lugs 16 of the first heat sink 10. Thus, the first heat sink 10 is retained to the second heat sink 10. Similarly, the second heat sink 10 is retained to the third heat sink 10, and the third heat sink 10 to the fourth heat sink 10.

Figure 5:
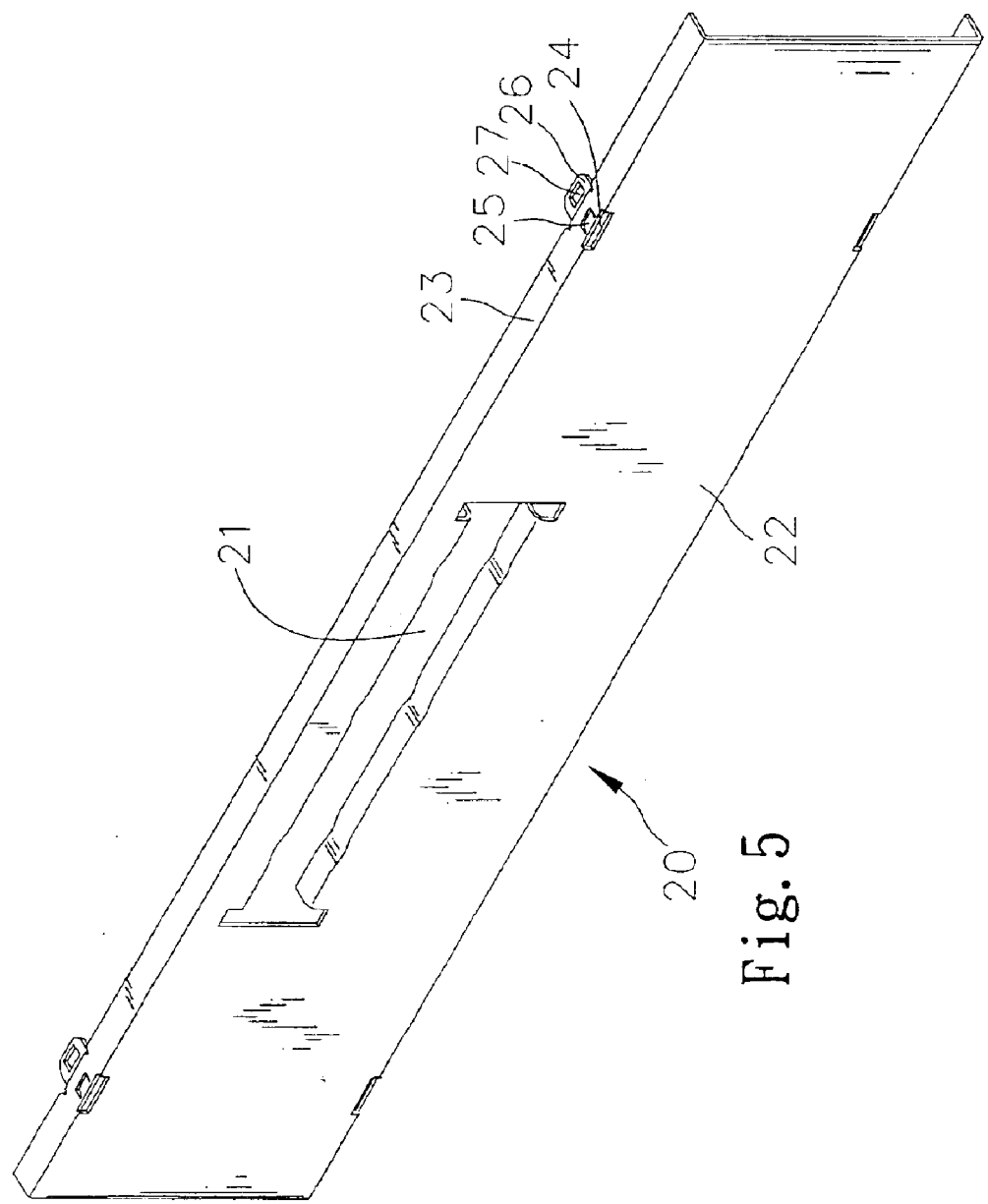
FIG. 5 is a perspective view of a heat sink of a second type used in the heat sink system of FIG. 1.

FIG. 5 shows a heat sink 20 according to a second embodiment of the present invention. The heat sink 20 includes four slots 24, four tongues 25 and four lugs 26 similar to the slots 14, the tongues 15 and the lugs 26 of the heat sink 10, respectively. Accordingly, each lug 26 defines an aperture 27. The heat sink 20 is different from the heat sink 10 in defining a window 21 instead of the recess 11.

Figure 6:
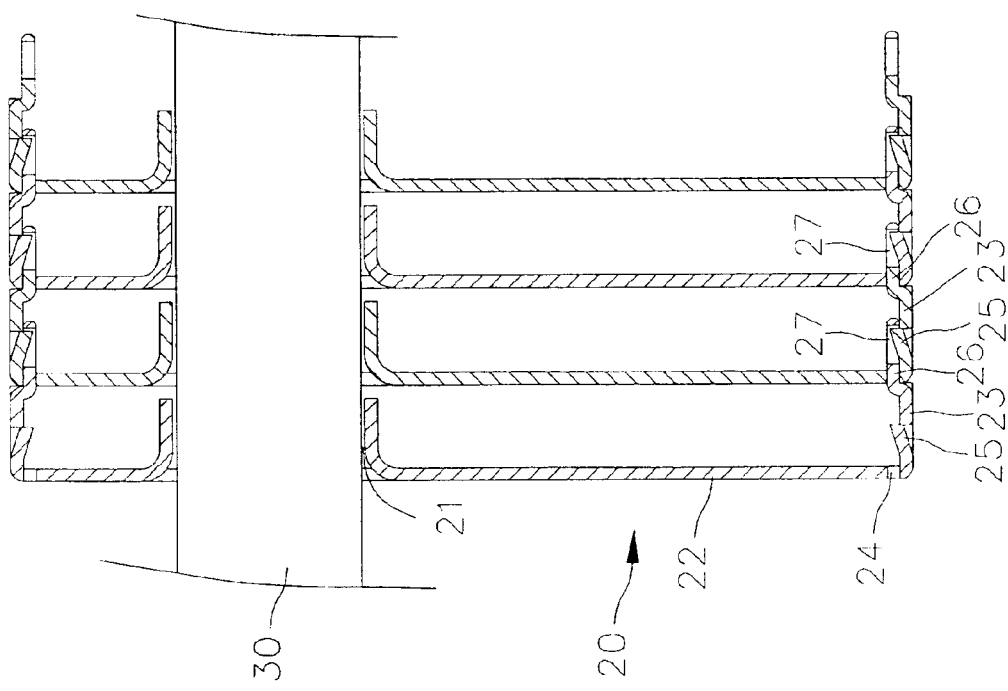
FIG. 6 is a cross-sectional view of several heat sinks of FIG. 5 connected with one another.
Figure 7:
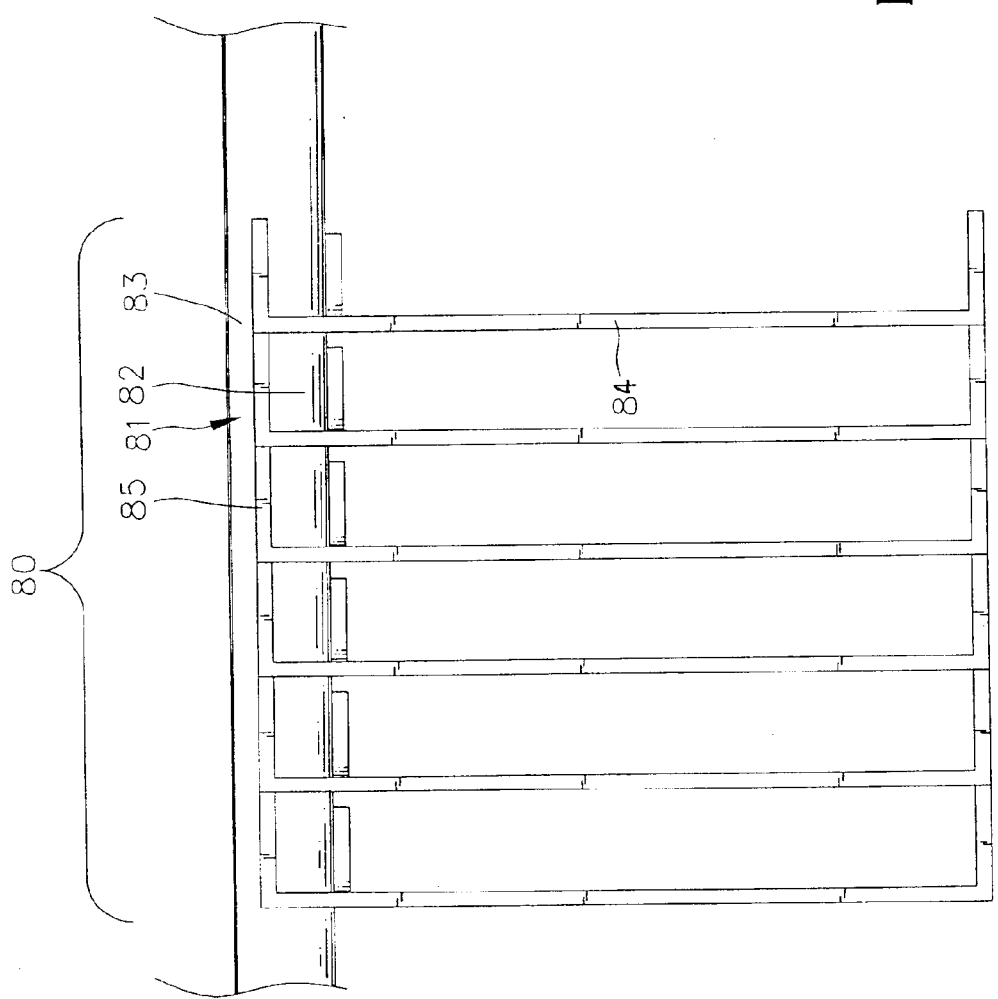
FIG. 7 is a left side view of a conventional heat sink system.
Figure 8:
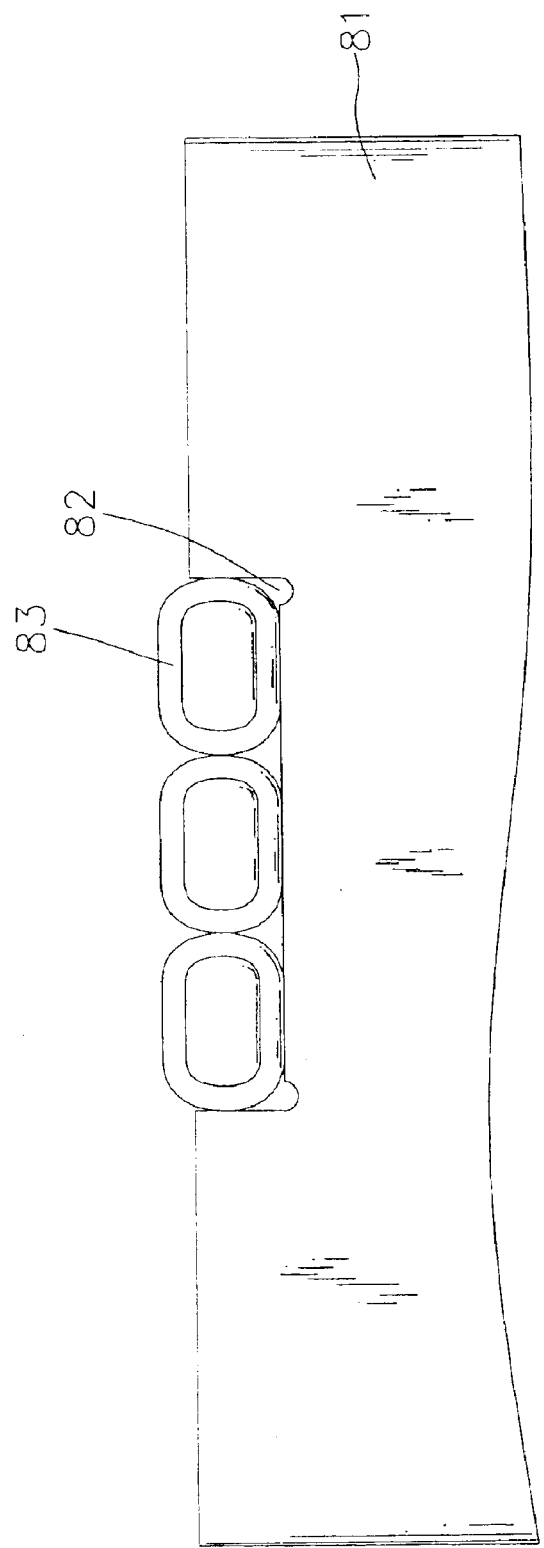
FIG. 8 is a front view of the heat sink system of FIG. 7.
Figure 9:
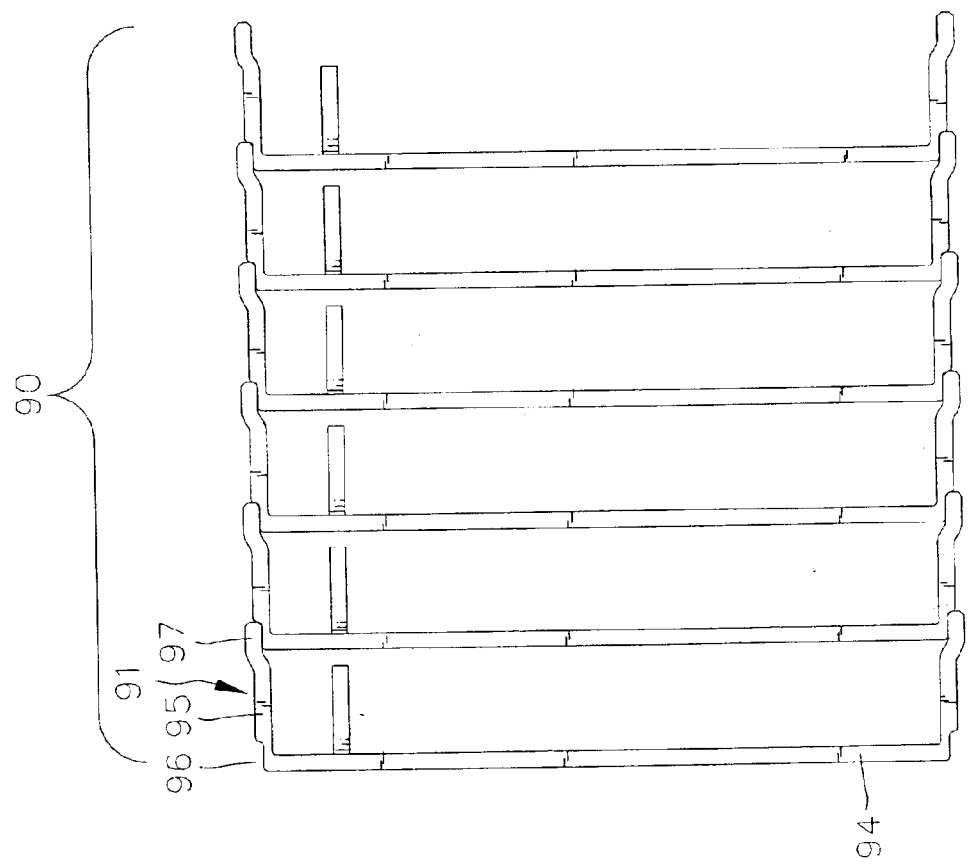
FIG. 9 is a perspective view of a conventional heat sink system.

Referring to FIG. 6, several heat sinks 20 are assembled. The copper bars 30 are inserted in the windows 21 of the heat sinks 20.

The present invention has been described via detailed illustration of some embodiments. Those skilled in the art can derive variations from the embodiments without departing from the scope of the present invention. Therefore, the embodiments shall not limit the scope of the present invention defined in the claims.

What is claimed is:

1. A heat sink including a strip, two flanges extending from a side of the strip, at least one slot defined in the strip near each of the flanges, at least one tongue projecting from an internal side of each of the flanges and at least one lug projecting from an edge of each of the flanges; and defining an aperture, wherein the lugs can be inserted through the slots of another heat sink so that the apertures thereof can receive the tongues of the other heat sink.

2. The heat sink according to claim 1 wherein the heat sink includes two slots defined in the strip near each of the flanges, two tongues projecting from each of the flanges and two lugs extending from each of the flanges.

3. The heat sink according to claim 1 wherein each of the tongues is formed by cutting a U-shaped slit into each of the flanges.

4. The heat sink according to claim 3 wherein the U-shaped slit is cut into each of the flanges via punching.

5. The heat sink according to claim 1 wherein the strip defines a recess in an edge thereof for receiving a copper bar.

6. The heat sink according to claim 1 wherein the strip defines a window for receiving a copper bar.

* * * * *